United States Patent
Campbell et al.

(12) 
(10) Patent No.: US 6,350,179 B2
(45) Date of Patent: Feb. 26, 2002

(54) METHOD FOR DETERMINING A POLISHING RECIPE BASED UPON THE MEASURED PRE-POLISH THICKNESS OF A PROCESS LAYER

(75) Inventors: William Jarrett Campbell; Jeremy Lansford, both of Austin, TX (US)

(73) Assignee: Advanced Micro Devices, Inc., Austin, TX (US)

(*) Notice: Subject to any disclaimer, the term of this patent is extended or adjusted under 35 U.S.C. 154(b) by 0 days.

(21) Appl. No.: 09/749,112

(22) Filed: Dec. 26, 2000

Related U.S. Application Data

(62) Division of application No. 09/372,515, filed on Aug. 11, 1999.

(51) Int. Cl.$^7$ ................................................. B24B 1/00
(52) U.S. Cl. .................................. 451/41; 451/5; 451/6; 451/63; 451/285; 451/287
(58) Field of Search ........................... 451/5, 6, 41, 63, 451/285, 287

(56) References Cited

U.S. PATENT DOCUMENTS

| | | | | |
|---|---|---|---|---|
| 5,791,969 A | * | 8/1998 | Lund | 451/5 |
| 6,068,539 A | * | 5/2000 | Bajaj et al. | 451/6 |
| 6,108,091 A | * | 8/2000 | Pecen et al. | 356/381 |

* cited by examiner

*Primary Examiner*—Derris H. Banks
*Assistant Examiner*—Shantese McDonald
(74) *Attorney, Agent, or Firm*—Williams, Morgan & Amerson, P.C.

(57) ABSTRACT

The present invention is directed to the field of semiconductor processing and, more particularly, to a method of planarizing or polishing process layers formed above a surface of a semiconducting substrate. In one illustrative embodiment, the method comprises determining the thickness of a process layer formed above a semiconducting substrate and determining a polishing recipe for said process layer based upon the measured thickness of said process layer.

8 Claims, 5 Drawing Sheets

METHOD FOR DETERMINING A POLISHING RECIPE BASED UPON THE MEASURED PRE-POLISH THICKNESS OF A PROCESS LAYER

This is a divisional of co-pending application Ser. No. 09/372,515, filed Aug. 11, 1999.

BACKGROUND OF THE INVENTION

1. Field of the Invention

The present invention is generally related to the field of semiconductor processing, and, more particularly, to a method for planarizing semiconductor wafers.

2. Description of the Related Art

Chemical mechanical polishing ("CMP") is widely used as a means of planarizing various process layers, e.g., silicon dioxide, formed above a wafer comprised of a semiconducting material, such as silicon. Chemical mechanical polishing operations typically employ an abrasive slurry distributed in an alkaline or acidic solution to planarize the surface of a process layer through the combination of mechanical and chemical actions.

FIG. 1 is a schematic drawing of one illustrative embodiment of a chemical mechanical polishing tool used in semiconductor processing operations. As depicted therein, the illustrative polishing tool 10 is comprised of a rotatable table 12 on which a polishing pad 14 is mounted, and a multi-head carrier 16 positioned above the pad 14. The multi-head carrier 16 includes a plurality of rotatable polishing arms 18, each of which includes a carrier head 20. Typically, wafers are secured to the carrier heads 18 by the use of vacuum pressure. This is sometimes referred to as the carrier backforce pressure. In use, the table 12 is rotated and an abrasive slurry is dispersed onto the polishing pad 14. Once the slurry has been applied to the polishing pad 14, a downforce is applied to each rotating polishing arm 18 to press its respective wafer against the polishing pad 14. As the wafer is pressed against the polishing pad 14, the surface of the wafer is mechanically and chemically polished. Although the device depicted in FIG. 1 is a multi-head polishing device, similar single-head type machines exist in the industry, and the present invention is not limited to any particular embodiment, form or structure of a tool that may be used to perform chemical mechanical polishing operations.

As known to those in the industry, there has been, and continues to be, a constant drive to reduce the various feature sizes of semiconductor devices, e.g., transistors, used in modem electronic devices. The continual drive to reduce the various feature sizes arises, in part, by the desire for devices that operate at faster and faster speeds. That is, all other things being equal, the smaller the channel length of a transistor, the faster the transistor will operate. This continual drive to reduce feature sizes on semiconductor devices has increased the importance of chemical mechanical polishing or planarization in the semiconductor fabrication process. For example, as feature sizes tend to decrease, the depth of field of photolithography equipment tends to shrink, thereby necessitating a very flat surface in order that very small dimensions may be accurately patterned on a wafer.

One problem encountered with known methods for performing CMP processes is that such methods fail to account for variations in the thickness of a process layer to be polished. For example, a particular process specification for a particular device may provide that a process layer comprised of, for example, silicon dioxide, is to be formed to a design thickness of 2000 Å. However, the thickness of the process layer after it is actually formed may vary from the design thickness, i.e., the thickness of the process layer may range between 1900 and 2100 Å due to inherent problems in forming such layers using existing semiconductor fabrication processes and equipment. In such situations, polishing recipes, e.g., the process parameters used to control polishing operations, such as the time duration of the polishing operation, the downforce applied by the polishing arm, etc., selected based upon the design thickness, e.g., 2000 Å, of the process layer, may be inadequate to compensate for the variations in the thickness of the process layer as actually formed. That is, in the case where the process layer is thicker than the design thickness, the standard process recipe would not remove enough of the process layer. Conversely, in situations where the process layer is formed to a thickness that is less than the design thickness, the standard process recipe may remove more of the layer than is desired.

The end result of all of these variations is that the thickness of a process layer on the wafer after it has been subjected to standard polishing operations deviates from what is anticipated by the design process. If the thickness of the process layer after polishing is less or greater than the desired thickness of the process layer after polishing, problems can occur. After polishing operations, wafers are typically subjected to photolithography and etching processes to define various structures or features in the process layer.

For example, after patterning a layer of a photoresist, the wafer may be subjected to one or more etching processes to define a plurality of gate conductors in a layer of polysilicon. In performing these etching operations, the wafer may be subjected to etching processes that are designed based upon the anticipated thickness of the process layer after polishing. If the process layer, after polishing, is less than the anticipated thickness, then the etching recipe may, in fact, over-etch the process layer which may lead to damage of the underlying surface. In the alternative case, if the process layer, after polishing, is thicker than the anticipated thickness of the process layer, the etching process based upon the anticipated thickness may be inadequate to remove all of the process layer. In the case of an interlayer dielectric layer, e.g., silicon dioxide, performing a standard polishing, operation on a process layer that is thinner than anticipated may lead to short circuits in the semiconductor device, or other types of problems.

Additionally, due to such problems, the wafer may need to be subjected to further processing operations, e.g., additional polishing or etching time, to compensate for the over-thickness of the process layer. All of these problems tend to increase the cost and time of semiconductor fabrication and may adversely impact device performance.

The present invention is directed to a method of solving, or at least reducing, some or all of the aforementioned problems.

SUMMARY OF THE INVENTION

The present invention is directed to a method of planarizing or polishing process layers formed above a surface of a semiconducting substrate. In one illustrative embodiment, the method comprises determining the thickness of a process layer formed above a semiconducting substrate and determining a polishing recipe for said process layer based upon the measured thickness of the process layer.

BRIEF DESCRIPTION OF THE DRAWINGS

The invention may be understood by reference to the following description taken in conjunction with the accompanying drawings, in which like reference numerals identify like elements, and in which.

Figure 1:
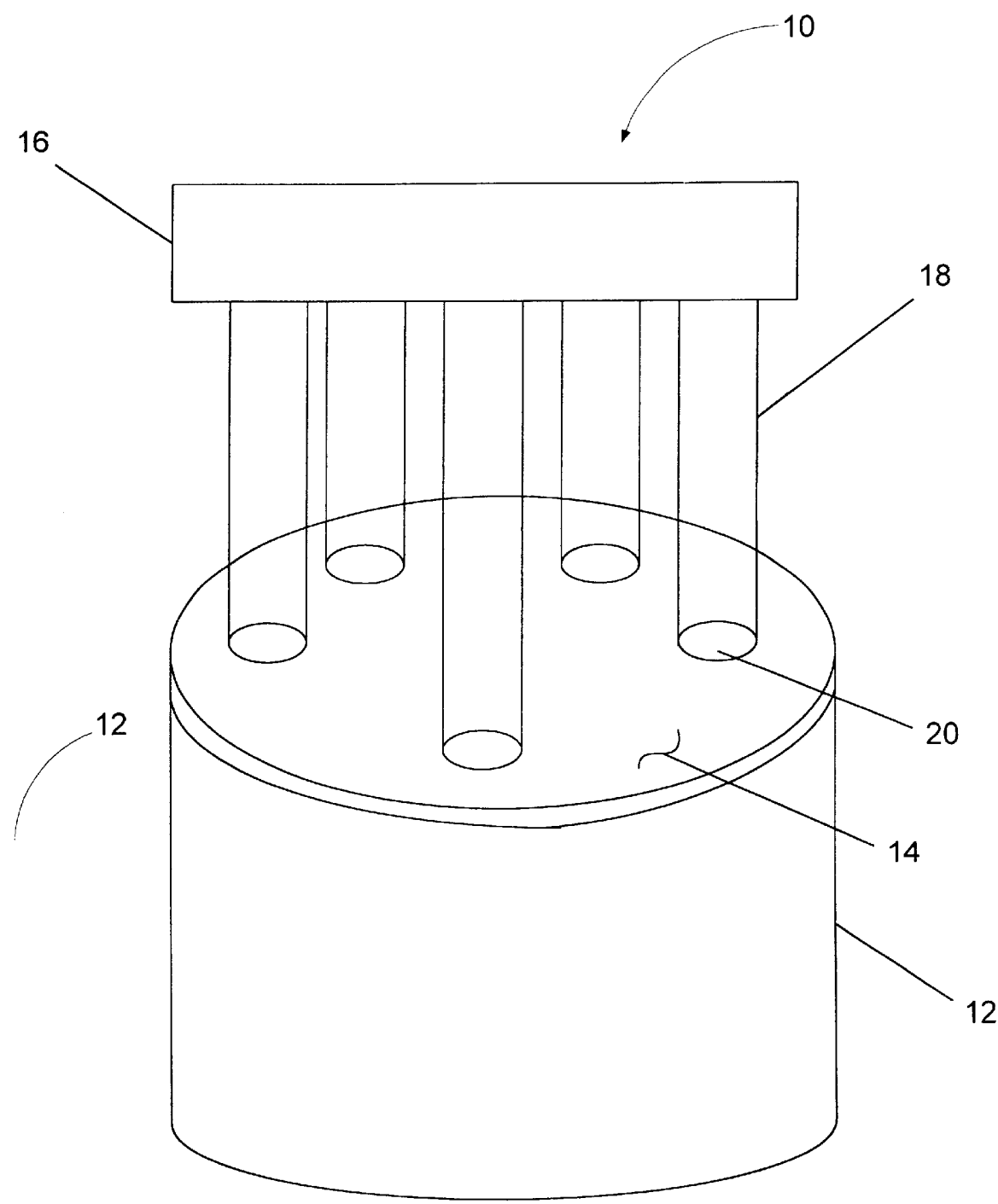
FIG. 1 is a schematic drawing of an illustrative polishing tool.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF THE INVENTION

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present invention is directed to a method of planarizing the surface of process layers formed above a semiconducting substrate. In disclosing the present invention, reference will be made to the illustrative embodiment of the invention depicted in FIGS. 2–5. The relative sizes of the various features depicted in the drawings may be exaggerated or reduced as compared to the size of those feature sizes on actual devices. Nevertheless, the attached drawings are included to aid in obtaining an understanding of the present invention. Moreover, the present method is applicable to a variety of technologies, e.g. NMOS, PMOS, CMOS, etc., and is readily applicable to a variety of devices, including, but not limited to, logic devices, memory devices, etc.

By way of background, an illustrative multiple arm polishing tool 10 is depicted in FIG. 1. The particular embodiment of the polishing tool 10 depicted in FIG. 1 is by way of example only. In one illustrative embodiment, the polishing tool 10 is a SpeedFam CMP V multi-arm polisher. As will be readily apparent to those skilled in the art upon a complete reading of the present application, the present invention is readily applicable to any tool for polishing or planarizing the surface of a process layer.

To planarize a process layer, the table 12 is rotated at typically a constant speed, and downforces are applied to each of the individual polishing arms 18 for a predetermined time. All of these parameters are based upon expected removal rates of the appropriate material under consideration. The polishing recipe may be controlled through a variety of parameters. In the illustrative embodiment of the polishing tool 10 disclosed herein, each of the polishing arms 18 is individually controllable. For example, the downforce applied by each polishing arm 18, the duration of the polishing operation performed by each polishing arm 18, the amount of carrier backforce pressure used to secure the wafer to each polishing arm 18, the rotational speed of each polishing arm 18, and/or the oscillation of each polishing arm 18 may be varied to control the polishing operations performed on a particular wafer. The above-identified list of parameters that may be varied is not intended to be exhaustive. Those skilled in the art will readily appreciate that, in using the present invention, any variable that affects the polishing recipe may be varied to achieve control of the polishing operations.

In general, the polishing recipe may be varied for each polishing arm 18. That is, in the illustrative polishing tool 10 disclosed herein, a different polishing recipe may be performed by each of the polishing arms 18, depending upon the measured thickness of the process layer to be polished. For example, the downforce pressure applied by each arm 18 may be different, as well as the duration of the polish by each arm 18. In short, the present invention allows polishing operations to be tailored to a particular wafer, depending upon the measured thickness of the process layer on that wafer that is to be polished. This technique takes into account actual variations in the thickness, as manufactured, of the process layers to be polished.

One illustrative embodiment of the present invention will now be described with reference to FIGS. 2 and 3 of the attached drawings. As shown therein, the present invention is comprised of determining the pre-polish thickness of a process layer, as indicated at block 30, and determining a polishing recipe for the process layer based upon the measured pre-polish thickness of the layer, as indicated at block 40. After polishing operations are completed in the polishing tool 10, using the recipe determined at block 40, the wafer exits the polishing tool 10 for further processing., e.g., photolithography and etching processes.

Figure 3:
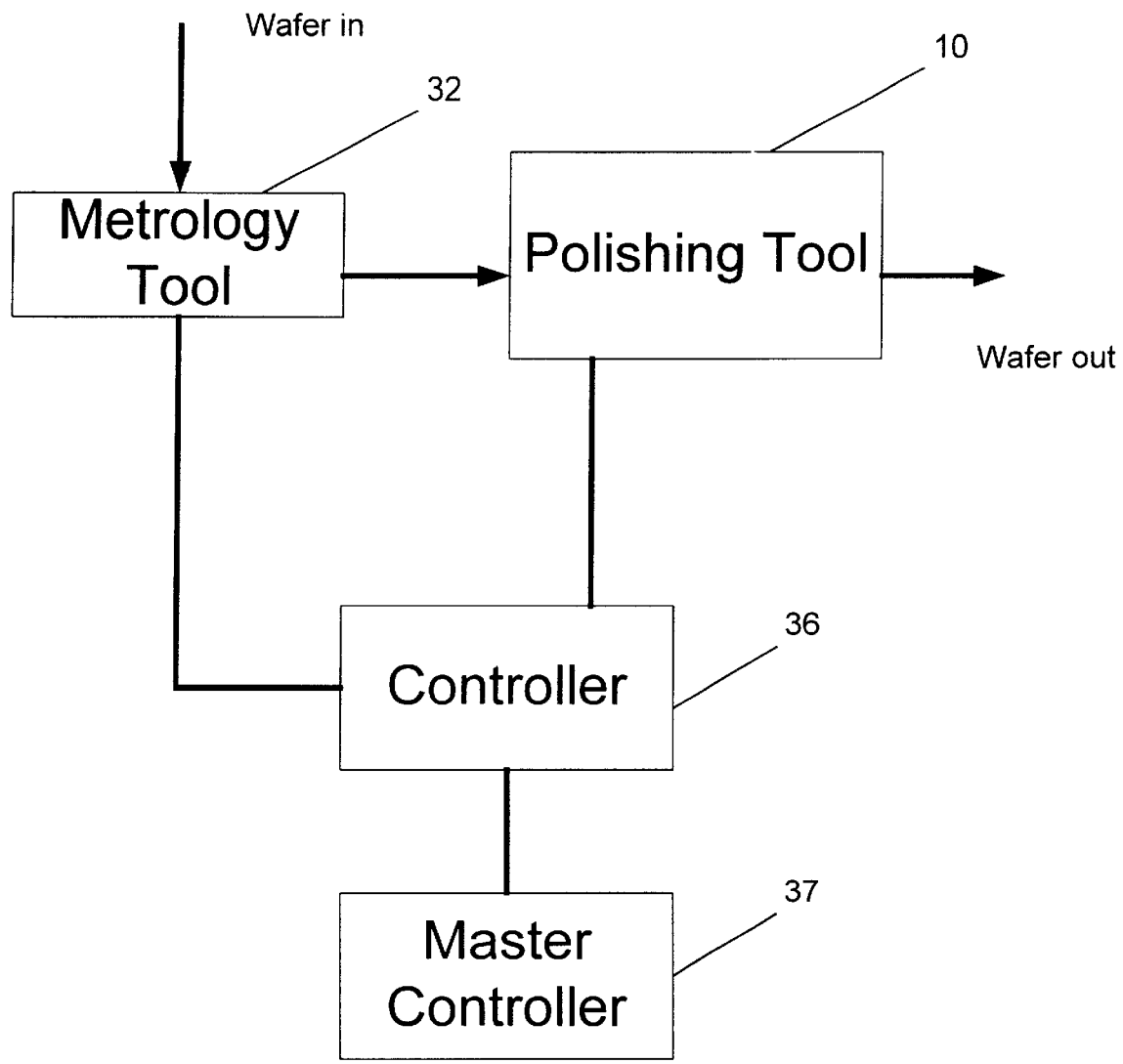
FIG. 3 is a schematic drawing of one illustrative embodiment of a system capable of employing the present invention.

As indicated in FIG. 3, the step of determining the pre-polish thickness of the process layer may be determined by a metrology tool 32. As will be apparent to those skilled in the art upon a complete reading of the present application, the metrology tool 32 may be any tool that is useful for measuring the thickness of a previously formed process layer. In one illustrative embodiment, the metrology tool 32 is an OptiProbe metrology tool by Therma-Wave, Inc. Depending upon the particular application, the metrology tool 32 may be used to determine an average thickness of the process layer, or it may be used to determine maximum or minimum thicknesses at any particular location of the process layer or the thickness distribution across the surface of the wafer, depending upon the particular design considerations.

The thickness of the process layer measured by the metrology tool 32 may be retrieved by a local controller 36, e.g., a configurable equipment interface (CEI) using standard GEMS/SECS protocols, which, in turn, may be transmitted to a master controller 37, e.g., a computer using the Advanced Process Control Framework software. In one embodiment, the local controller 36 sends the master controller 37 information on the wafer inspected at the metrology tool 32, e.g., the measured thickness of the process layer, lot number, wafer number, production route, operation, etc. When the lot arrives at the polish operation, the master controller 37 retrieves the information regarding the appropriate wafer and at least the measured thickness of the process layer on the wafer. Although the local controller 36 and the master controller 37 are depicted as separate entities in the illustrative embodiment, those skilled in the art will recognize that the functionality performed by the local controller 36 and the master controller 37 could be performed by a single controller. Moreover, the functionality of the master controller 37 and the local controller 36 could be implemented on the computers and/or controllers resident on the polishing tool 10. Thus, the particular configuration depicted in the drawings should not be considered a limitation of the present invention.

Figure 2:
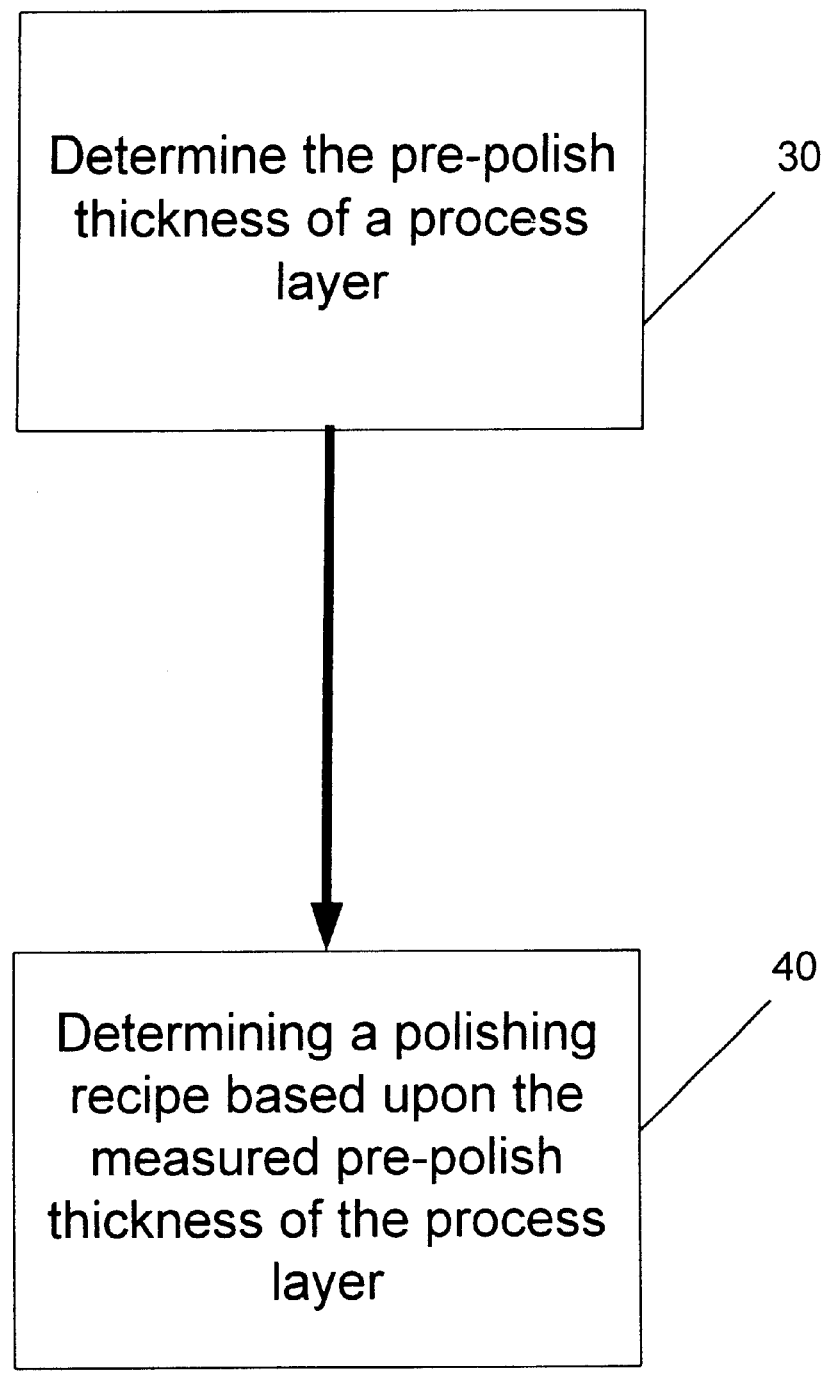
FIG. 2 is a flowchart depicting one illustrative embodiment of the present invention.
Figure 4:
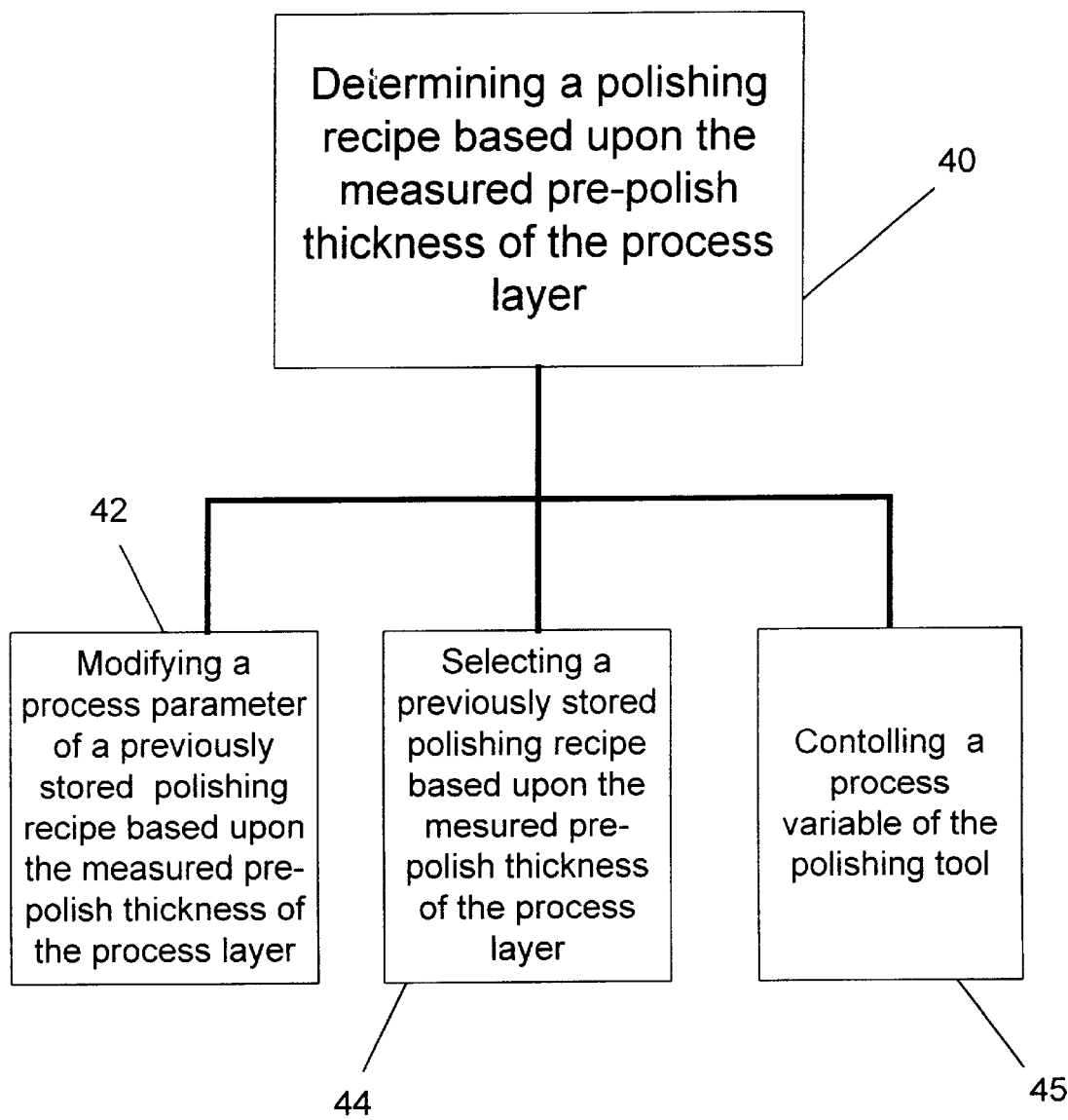
FIG. 4 is a graphical depiction of alternative illustrative techniques for performing the present invention.

As indicated in FIG. 4, the step of determining a polishing recipe for the process layer based upon the measured pre-polish thickness of the layer, as indicated at block 40 in FIGS. 2 and 4, may be accomplished in several different ways. The particular techniques employed are matters of design choice, and these techniques may be influenced by the control system of the local controller 36 and the control system resident on the polishing tool 10. By way of example, in some control schemes, a polishing recipe may be downloaded from the master controller 37 and at least one of the parameters of a previously stored polishing recipe may be modified by, for example, the local controller 36 or master controller 37, based upon the pre-polish thickness measurement obtained by the metrology tool 32, as indicated at block 42 of FIG. 4. Another technique may involve pre-storage of multiple polishing recipes on, for example, the master controller 37. Each of the polishing recipes would be applicable to a pre-selected range of pre-polish thicknesses of the process layer. Depending upon the pre-polish thickness of the process layer, as determined by the metrology tool 32, the appropriate recipe may be selected and downloaded to the polishing tool 10, as indicated at block 44 of FIG. 4. In yet another example, the polishing tool 10 will allow the local controller 36 to directly control a parameter of the polishing tool 10, as indicated at block 45 of FIG. 4, e.g., the local controller 36 may also be able to directly control the rotational speed of each of the rotating polishing arms 18. Other techniques and methods for achieving the above-described results will be recognized by those skilled in the art with the benefit of the present disclosure.

By way of example, the operations performed at block 42 may comprise adjusting any variable of the polishing recipe that may be used to control the amount of material removed by the polishing operation. The operations at block 42 may involve taking a previous recipe that was designed for an anticipated thickness of the process layer and varying one or more process parameters. For example, if the measured pre-polish thickness of the process layer is greater than anticipated, the nominal polishing recipe may be adjusted so that more material is removed, i.e., the polishing arm downforce may be increased, the duration of the polish may be increased, etc. Of course, more than one variable may be adjusted in order to accomplish this goal.

As an alternative, the step of determining a polishing recipe, as indicated at block 40, may be accomplished, as indicated at block 44, by selecting a recipe based upon the measured thickness of the process layer. In this illustrative embodiment, multiple polishing recipes, correlated with a measured pre-polish thickness, or range of thicknesses, of the process layer, may be stored in, for example, the local controller 36, the master controller 37, or on the control system of the polishing tool 10. That is, using this technique, a variety of different polishing recipes may be stored for appropriate pre-process thicknesses, or range of thicknesses, of the process layer. Based upon the thickness measurement obtained from the metrology tool 32, the appropriate polishing recipe is selected and performed at the polishing tool 10.

As another example, the operations performed at block 42 may involve controlling a process variable of the polishing tool 10, as indicated at block 45. In this technique, the local controller 36 may directly control the process parameters of the polishing tool 10. For example, the local controller 36 may be used to directly modify a parameter of the polishing recipe, e.g., polishing arm downforce. In effect, the controller 36 may be used to adjust at least one process variable of a polishing recipe to a new variable based upon the pre-polish thickness of the process layer. Thereafter, polishing operations are performed on the process layer using a polishing recipe that includes the new value of the process variable. The parameter controlled, as well as the magnitude of any changes, are determined based upon the measured thickness of the process layer. Of course, more than one process variable may be changed. In this technique, the local controller 36 may actually override the control system resident on the polishing tool 10.

Figure 5:
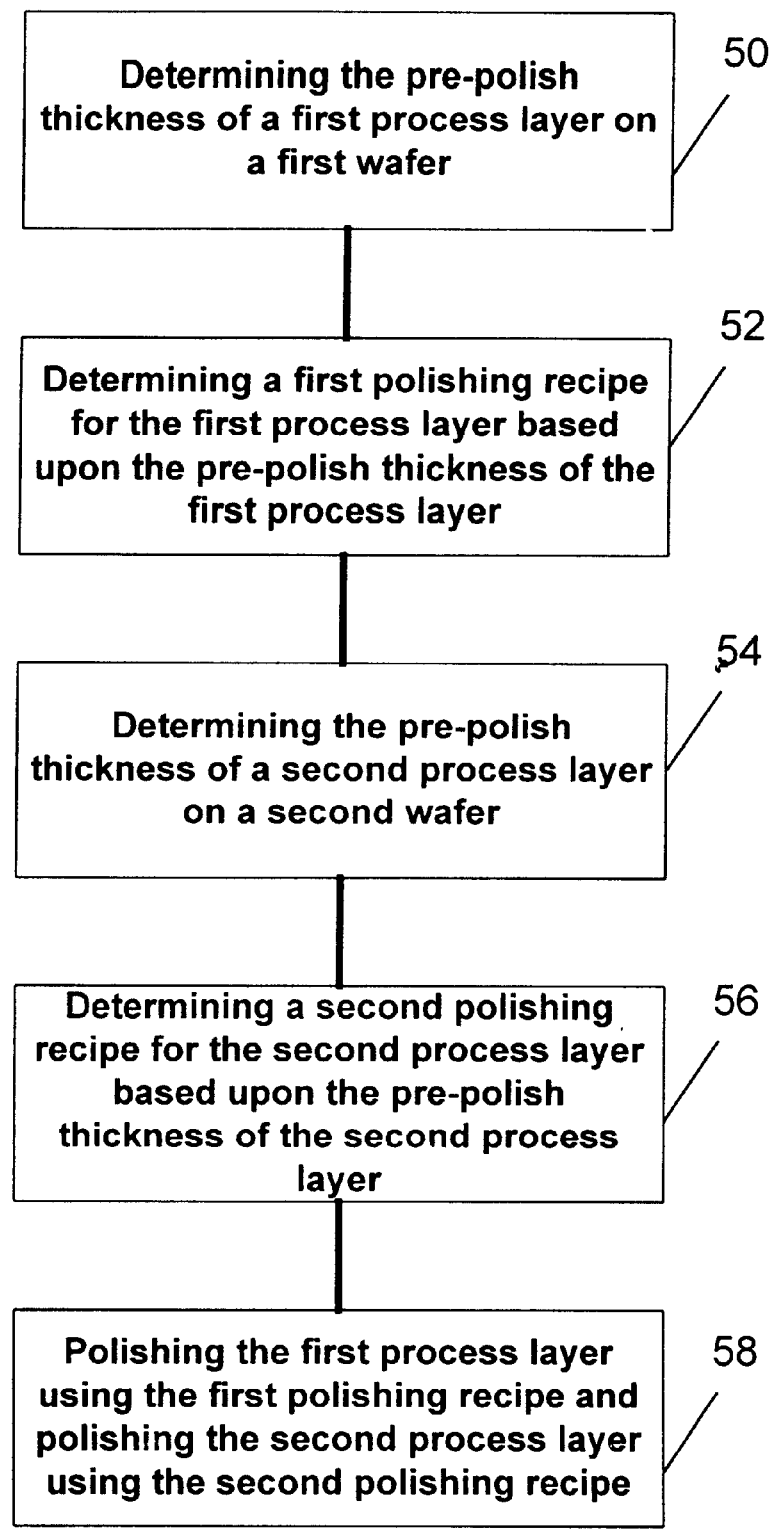
FIG. 5 is another illustrative embodiment of the present invention.

Yet another illustrative embodiment of the present invention is directed in FIG. 5. The illustrative method comprises determining the pre-polish thickness of a first process layer on a first wafer comprised of a semiconducting substrate, as indicated at block 50, and determining a polishing recipe for the first process layer based upon the pre-polish thickness of the first process layer, as indicated at block 52. The illustrative method further comprises determining the pre-polish thickness of a second process layer on a second wafer comprised of a semiconducting substrate, as indicated at block 54, and determining a polishing recipe for the second process layer based upon the pre-polish thickness of the second process layer, as indicated at block 56. The method also comprises polishing the first process layer using the first polishing recipe and polishing the second process layer using the second polishing recipe, as indicated at block 58.

As will be apparent to those skilled in the art upon a complete reading of the present invention, the order of the steps depicted in FIG. 5 may be varied. Additionally, the various acts identified in FIG. 5, e.g., the act of polishing the first and second process layers, as indicated at block 58, may be performed at the same time or at different times. The steps of determining the pre-polish thickness of the first and second process layers, as indicated at blocks 50 and 54, may be accomplished by any metrology tool, such as the illustrative OptiProbe described above. The steps of determining a first and second polishing recipe, as indicated at blocks 52 and 56, may be accomplished by at least the three illustrative techniques indicated at blocks 42, 44 and 45 of FIG. 4. Moreover, depending upon the pre-polish thickness of the first and second process layers, the first and second polishing recipes may turn out to be the same or very similar. Of course, they may also be different. Lastly, the acts of polishing the first and second process layers, as indicated at block 58, may be performed in a single polishing tool, or they may be performed in separate polishing tools.

The present invention may also be embodied in a machine or computer readable format, e.g., an appropriately programmed computer, a software program written in any of a variety of programming languages. The software program would be written to carry out various functional operations of the present invention, such as those indicated in FIGS. 4A and 4B, and elsewhere in the specification. Moreover, a machine or computer readable format of the present invention may be embodied in a variety of program storage devices, such as a diskette, a hard disk, a CD, a DVD, a nonvolatile electronic memory, or the like. The software program may be run on a variety of devices, e.g., a processor.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A system, comprising:
   a metrology tool for determining a thickness of a process layer;
   a planarization tool adapted to perform a planarization recipe that is determined based upon the thickness of said process layer; and
   a controller resident on said planarization tool that allows communications between said metrology tool and said planarization tool.

2. The system of claim 1, wherein said planarization tool is a chemical mechanical polishing tool.

3. The system of claim 1, wherein said metrology tool is an ellipsometer.

4. A system, comprising:
   a metrology tool for determining a thickness of a process layer;
   a planarization tool adapted to perform a planarization recipe that is determined based upon the thickness of said process layer; and
   a controller resident on said metrology tool that allows communications between said metrology tool and said planarization tool.

5. The system of claim 4, wherein said planarization tool is a chemical mechanical polishing tool.

6. The system of claim 4, wherein said metrology tool is an ellipsometer.

7. A system, comprising:
   a metrology tool comprised of an ellipsometer for determining a thickness of a process layer;
   a chemical mechanical polishing tool adapted to perform a polishing recipe that is determined based upon the thickness of said process layer; and
   a controller resident on said chemical mechanical polishing tool that allows communications between said metrology tool and said chemical mechanical polishing tool.

8. A system, comprising:
   a metrology tool comprised of an ellipsometer for determining a thickness of a process layer;
   a chemical mechanical polishing tool adapted to perform a polishing recipe that is determined based upon the thickness of said process layer; and
   a controller resident on said metrology tool that allows communications between said metrology tool and said chemical mechanical polishing tool.

* * * * *